US012648255B2

(12) United States Patent
Jeronimo

(10) Patent No.: US 12,648,255 B2
(45) Date of Patent: Jun. 2, 2026

(54) METHOD AND SYSTEM FOR TREATING A STACK INTENDED FOR THE MANUFACTURE OF A HETEROJUNCTION PHOTOVOLTAIC CELL

(71) Applicant: COMMISSARIAT À L'ENERGIE ATOMIQUE ET AUX ENERGIES ALTERNATIVES, Paris (FR)

(72) Inventor: Pedro Jeronimo, Grenoble cedex 09 (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 474 days.

(21) Appl. No.: 18/549,757

(22) PCT Filed: Feb. 16, 2022

(86) PCT No.: PCT/EP2022/053843
§ 371 (c)(1),
(2) Date: Oct. 10, 2023

(87) PCT Pub. No.: WO2022/189110
PCT Pub. Date: Sep. 15, 2022

(65) Prior Publication Data
US 2024/0162368 A1    May 16, 2024

(30) Foreign Application Priority Data
Mar. 8, 2021    (FR) ...................................... 21 02211

(51) Int. Cl.
*H01L 31/18*        (2006.01)
*H01L 31/20*        (2006.01)
(Continued)

(52) U.S. Cl.
CPC ......... *H10F 71/121* (2025.01); *H10F 71/103* (2025.01)

(58) Field of Classification Search
None
See application file for complete search history.

(56) References Cited

U.S. PATENT DOCUMENTS

2005/0189340 A1*  9/2005  Talwar .................... H10P 95/90
                                                          257/E21.336
2015/0013758 A1    1/2015  Harrison et al.

FOREIGN PATENT DOCUMENTS

FR          3 099 294 A1    1/2021
WO     WO 2013/001440 A1    1/2013
WO     WO 2020/082131 A1    4/2020

OTHER PUBLICATIONS

International Search Report & Written Opinion issued Jun. 27, 2022 in PCT/EP2022/053843, filed on Feb. 16, 2022, 19, pages (with English Translation).

(Continued)

*Primary Examiner* — Asok K Sarkar
(74) *Attorney, Agent, or Firm* — Oblon, McClelland, Maier & Neustadt, L.L.P.

(57) ABSTRACT

A process for treating a stack intended for manufacture of a photovoltaic cell includes placing the stack in an enclosure, exposing the stack to electromagnetic radiation, and cooling the stack during exposure. The photovoltaic cell is cooled by injecting a gas flow into the enclosure, regulating the injected gas flow taking into account the temperature of the stack, and evacuating the gas flow from the enclosure taking into account the ambient temperature present in the enclosure.

13 Claims, 6 Drawing Sheets

(51) Int. Cl.
    H10F 71/00        (2025.01)
    H10F 71/10        (2025.01)

(56)            References Cited

OTHER PUBLICATIONS

Madumelu et al. "Investigation of Light-induced degradation in N-type silicon heterojunction solar cells during illuminated annealing at elevated temperatures", Solar Energy Materials & Solar Cells, vol. 218, 2020, 9 pages.

* cited by examiner

METHOD AND SYSTEM FOR TREATING A STACK INTENDED FOR THE MANUFACTURE OF A HETEROJUNCTION PHOTOVOLTAIC CELL

TECHNICAL FIELD OF THE INVENTION

The present invention relates to a process for treating a stack intended for manufacture of a heterojunction photovoltaic cell.

The invention also relates to the corresponding treatment system, intended to implement said process.

PRIOR ART

Silicon heterojunction (SHJ) photovoltaic cells are known to see their energy conversion efficiency improve by about 0.3% absolute under the combined action of light and heat. Thus, it is now common to carry out a light-soaking treatment to improve stacks, notably those intended to form SHJ photovoltaic cells, in order to increase their conversion efficiency.

Document WO2013/001440 describes one example of a process for treating SHJ photovoltaic cells comprising a substrate made of n-doped crystalline silicon. In this treatment process, the photovoltaic cell is subjected to a light flux of irradiance higher than or equal to 500 W/m 2 for a time of about 10 hours, while being heated to a temperature comprised between 20° C. and 200° C. Such a treatment time is however incompatible with the production rate of present-day lines for manufacturing photovoltaic cells.

Patent application FR3099294A1 describes a process for treating what is referred to as a precursor stack of a heterojunction photovoltaic cell. This process is implemented at the end of manufacture and mainly consists in exposing said stack to intense electromagnetic radiation (irradiance higher than 200 kW/m$^2$) for a relatively short time (about ten seconds). By virtue of this brief but intense exposure to radiation, the obtained cell is improved and its operating efficiency increased.

When exposed to electromagnetic radiation, the temperature of the stack increases greatly and may reach a value above 200° C., potentially one as high as 240° C. In order to limit the temperature of the stack to a value below 200° C. and to avoid deterioration of the obtained cell, it is necessary to provide a cooling solution. The aforementioned patent application FR3099294A1 mentions the need for cooling, without disclosing any concrete elements for achieving it.

The publication referenced "MADUMELU CHUKWUKA ET AL: *"Investigation of light induced degradation in N-type silicon heterojunction solar cells during illuminated annealing at elevated temperatures"*— Solar Energy Materials and Solar Cells, Elsevier Science Publishers, Amsterdam NL— vol. 218, Sep. 1, 2020— XP086293834" concerns a study of the degradation of heterojunction PV cells when they are subjected to a high temperature.

The aim of the invention is therefore to provide a process for treating a photovoltaic-cell precursor stack, which allows the integrity of the stack to be maintained, during its exposure to electromagnetic radiation.

The process notably allows photovoltaic cells to be treated continuously, at a high rate, thus allowing the process to be industrialized.

SUMMARY OF THE INVENTION

This aim is achieved by way of a process for treating a stack that comprises at least:

a crystalline silicon substrate,
a first passivation layer made of hydrogenated amorphous silicon, placed on a first side of the substrate,
a first layer made of amorphous silicon doped a first conductivity type, placed on the first passivation layer,
said process comprising steps of:
placing said stack in an enclosure,
exposing said stack to electromagnetic radiation,
measuring the temperature of the stack,
measuring the ambient temperature present in said enclosure,
cooling said stack during exposure,
said process being characterized in that said stack is cooled by:
injecting a gas flow into said enclosure,
regulating the injected gas flow taking into account the measured temperature of the stack,
evacuating the gas flow from the enclosure taking into account the ambient temperature measured in said enclosure.

According to one particularity, the regulating step comprises steps of:
measuring the temperature of the stack,
comparing the measured temperature with a first setpoint value,
controlling an injection valve controlling injection of the gas flow into the enclosure depending on the difference between the measured temperature and said setpoint value.

According to another particularity, the step of evacuating the gas flow comprises steps of:
measuring the ambient temperature present in said enclosure,
comparing the measured ambient temperature with a second setpoint value,
controlling means for evacuating the gas flow from the enclosure depending on the difference between the measured ambient temperature and said second setpoint value.

Another aim of the invention is to provide a treatment system also allowing this objective to be met.

This aim is achieved by way of a system for treating a stack intended for manufacture of a photovoltaic cell, said stack comprising at least:
a crystalline silicon substrate,
a first passivation layer made of hydrogenated amorphous silicon, placed on a first side of the substrate,
a first layer made of amorphous silicon doped a first conductivity type, placed on the first passivation layer,
said system comprising:
an enclosure intended to receive said stack,
a source configured to emit electromagnetic radiation towards said stack,
said system comprising:
first means for measuring the temperature of the stack,
said system being characterized in that it comprises:
second means for measuring the ambient temperature inside the enclosure,
means for injecting a gas flow into the enclosure via a main inlet,
first control means for controlling said means for injecting the gas flow, taking into account the measured temperature of the stack,
means for evacuating the gas flow from the enclosure,
second control means for controlling the evacuating means, taking into account the ambient temperature measured inside the enclosure.

According to one particularity, the means for emitting electromagnetic radiation comprise light-emitting diodes.

According to another particularity, the means for injecting the gas flow comprise at least one valve that is controllable by said first control means, said valve being arranged on said main gas inlet.

According to another particularity, the injecting means comprise a plurality of apertures that are produced through a wall of said enclosure and that are connected to said main gas inlet.

According to another particularity, the injecting means comprise a channel for distributing the gas, arranged between said main inlet and said apertures.

According to another particularity, said distributing channel is of the planar spiral type.

According to another particularity, the system comprises means for cooling said source of electromagnetic radiation and/or the gas flow injected into said enclosure. These cooling means may comprise a serpentine through which a heat-transfer fluid flows.

According to another particularity, the means for evacuating the gas flow comprise one or more fans arranged in a wall of the enclosure.

According to another particularity, the system comprises first means for measuring the temperature of the stack.

According to another particularity, the first control means are configured to execute a first temperature-regulating loop, based on the temperature measured by the first measuring means and on a first setpoint value.

According to another particularity, the system comprises second means for measuring the ambient temperature inside the enclosure.

According to another particularity, the second control means are configured to execute a second temperature-regulating loop based on the temperature measured by the second measuring means and on a second setpoint value.

BRIEF DESCRIPTION OF THE FIGURES

Other features and advantages will become apparent from the following detailed description, which is given with reference to the appended drawings, in which.

DETAILED DESCRIPTION OF AT LEAST ONE EMBODIMENT

In the remainder of the description, the terms "upper", "lower", "above" and "below" or equivalent are to be understood with reference to a vertical direction drawn in the plane of the sheet and referred to as the main direction (A).

Figure 1:
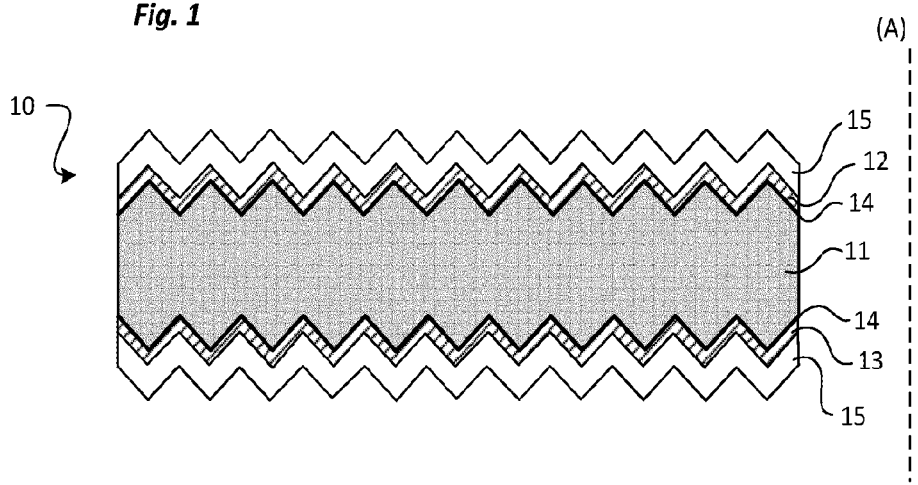
FIG. 1 schematically shows the treatment system of the invention.

The process of the invention is applicable to a stack of layers used to manufacture a heterojunction photovoltaic cell. Such a stack is generally referred to as a "photovoltaic-cell precursor". Non-limitingly, as described in patent application FR3099294A1 and shown in FIG. 1, the stack 10 may have the following architecture:

a substrate 11 made of crystalline silicon, n-doped crystalline silicon for example;

a first passivation layer 14 made of hydrogenated (and preferably intrinsic) amorphous silicon, placed on the first side of the substrate 11;

a first amorphous-silicon layer 12, placed on the first passivation layer 14 and doped a first conductivity type;

a first transparent-conductive-oxide layer 15 placed on the first doped amorphous-silicon layer 12;

a second passivation layer 14 made of hydrogenated (and preferably intrinsic) amorphous silicon, placed on the second side of the substrate 11;

a second amorphous-silicon layer 13, placed on the second passivation layer 14 and doped a second conductivity type opposite the first conductivity type; and a second transparent-conductive-oxide layer 15 placed on the second doped amorphous-silicon layer 13.

Such a stack is termed asymmetric, since it is equipped with two amorphous-silicon layers 12, 13 doped with opposite conductivity types, one on either side of the substrate 11.

As indicated in the aforementioned patent application FR3099294A1, the process is a so-called light-soaking process, which consists in exposing a stack to a heat treatment under irradiation; in order to improve the efficiency of the cell during its operation. The process is in particular carried out through exposure to electromagnetic radiation R using a radiation source such as, for example, light-emitting diodes. Thus, the stack is exposed to electromagnetic radiation R for a treatment time t that is dependent on the total irradiance E of the emitted radiation and on its wavelength or wavelengths.

At least one side of the stack 10 is exposed to said radiation R. Of course, it is also possible to expose both sides of the stack, either one after the other or both sides at the same time. In the latter case, a second radiation source would be employed to illuminate the second side.

Non-limitingly, the exposed side may be irradiated with radiation R having an irradiance E of less than or equal to 200 kW/m² and preferably between 25 and 100 kW/m² and for example of the order of 50 kW/m². The treatment time is advantageously comprised between 1 s and 30 s. The treatment temperature is in particular comprised between 100 and 250° C., and is preferably of the order of 200° C.

Figure 3:
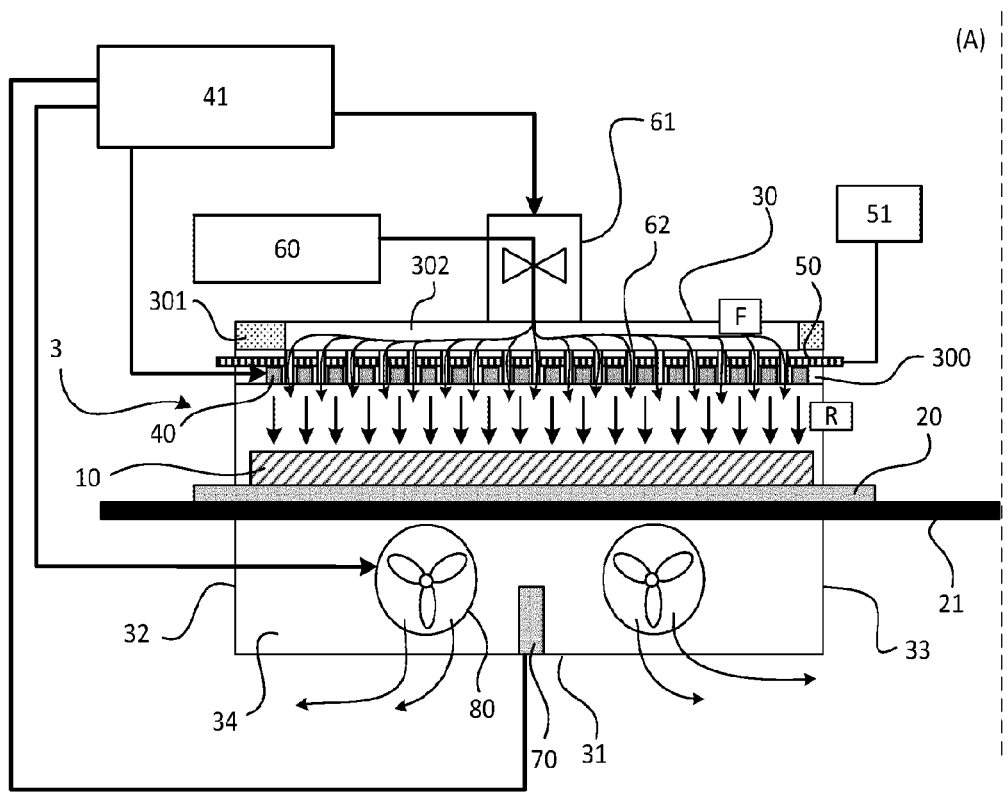
FIG. 3 schematically shows the architecture of the system of the invention and illustrates its operating principle.
Figure 4:
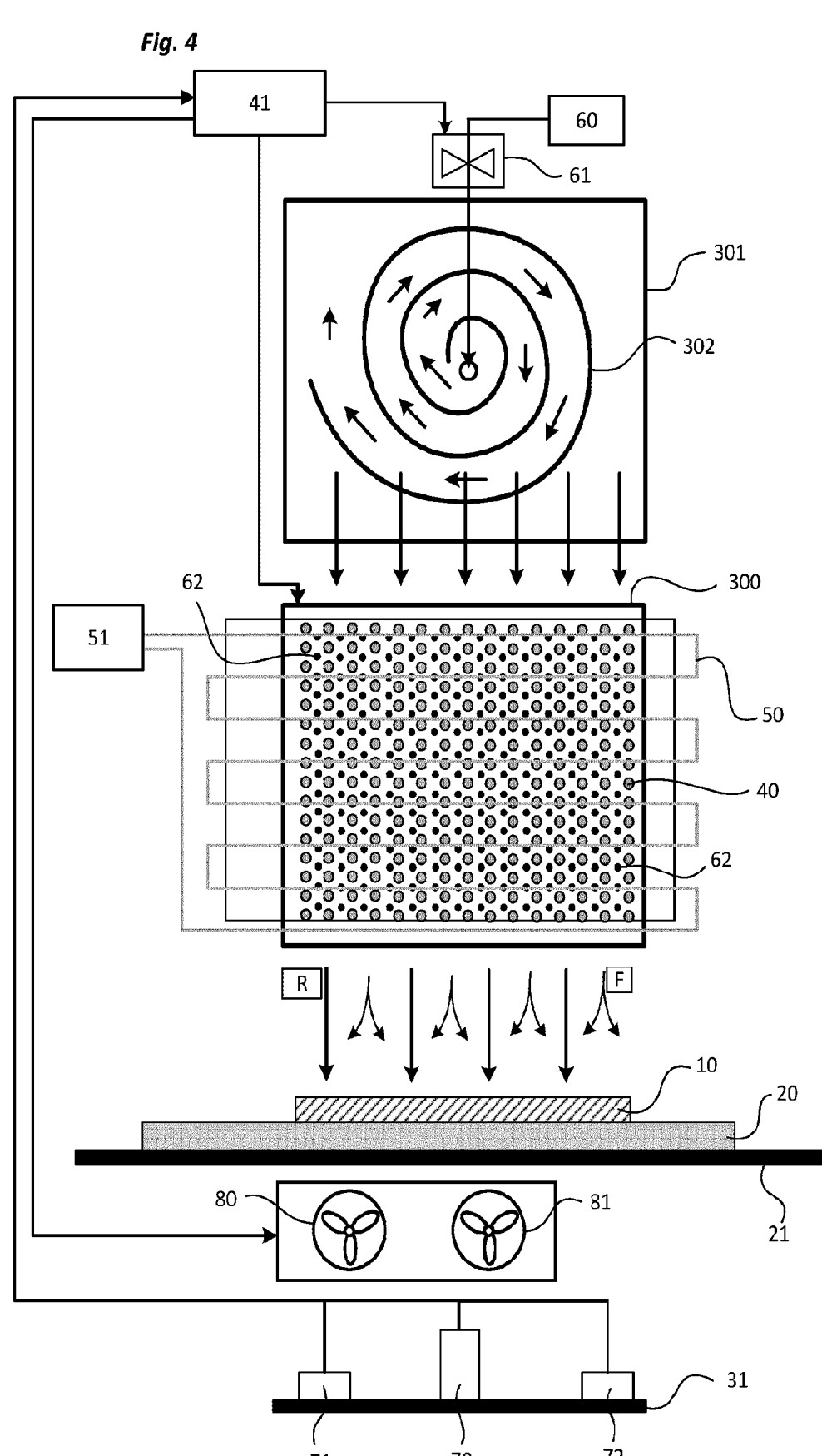
FIG. 4 illustrates, via an exploded view, the architecture of the system of the invention and illustrates its operating principle.

In FIGS. 3 and 4, the stack 10 has been shown in the form of a rectangular parallelepiped.

Figure 2:
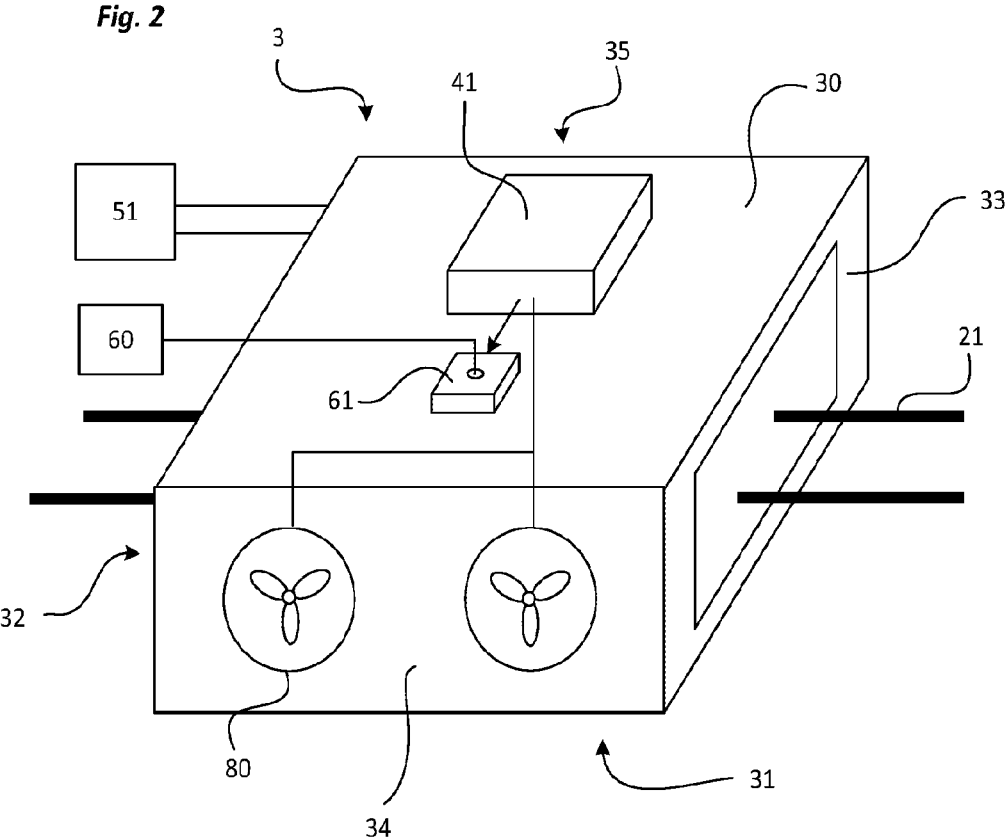
FIG. 2 shows, via a perspective view, the system of the invention.

The treatment system for light soaking the stack 10 is described with reference to FIG. 2, FIG. 3 and FIG. 4.

The treatment system may comprise a holder on which the stack 10 to be irradiated is placed. This holder 20 may be placed on a conveying system comprising one or more conveyor belts 21, which are intended to pass through the treatment system of the invention.

The treatment system of the invention comprises an enclosure 3, for example of parallelepipedal shape. This enclosure 3 is made of a heat-resistant material, of a metal for example, for example steel, aluminium or stainless steel.

The enclosure 3 thus comprises a wall 30 referred to as the upper wall, a wall 31 referred to as the lower wall and four pairwise-opposite sidewalls referred to as the first sidewalls 32, 33 and the second sidewalls 34, 35. The enclosure 3 is open on two of the opposite sidewalls, the first sidewalls 32, 33 for example, so that the two conveyor belts 21 of the holder 20 are able to pass right therethrough. When the stack 10 passes through the enclosure 3, the latter is arranged in a plane parallel to the upper wall 30 of the enclosure 3.

The system includes a first radiation-emitting unit. This first unit is, for example, integrated into the upper wall 30 of the enclosure 3. It comprises the radiation source, which is for example composed of one or more light-emitting diodes 40, and an electrical control and supply assembly 41 that is intended to supply and control said radiation source. As a variant, the source may also comprise one or more halogen or xenon lamps. The source may also be composed of a plurality of components of a distinct nature, chosen for example from among light-emitting diodes, halogen lamps and xenon lamps.

Non-limitingly, the light-emitting diodes 40 may be aligned in a plurality of rows and integrated into a first panel 300 forming part of the upper wall 30 of the enclosure 3. The light-emitting diodes 40 are oriented so as to emit their light signal towards the inside of the enclosure 3, substantially in a direction perpendicular to the plane formed by the stack 10 to be irradiated. Each row of light-emitting diodes 40 may take the form of a strip of a plurality of light-emitting diodes connected in series. The strips of light-emitting diodes may be connected in parallel to the electrical control and supply assembly 41 or each supplied and controlled independently through a separate channel of the electrical control and supply assembly 41.

As indicated above, the radiation R emitted by the light-emitting diodes 40 towards the stack 10 causes a large increase in the temperature of the stack, and inside the enclosure 3.

The system thus comprises a cooling unit, arranged and configured to keep the temperature of the stack 10 below a threshold value and thus to avoid potential degradation thereof. The cooling unit may be activated during the phase of exposure to radiation and optionally after this phase of exposure to radiation to decrease the temperature to acceptable values.

The cooling unit comprises the following main elements:
means for injecting a gas flow F into the enclosure 3,
first control means for controlling said means for injecting the gas flow F,
means for evacuating the gas flow F from the enclosure,
second control means for controlling these evacuating means.

The gas flow F is advantageously injected at a temperature sufficient to lower the temperature of the stack 10 and thus to prevent its degradation. Means for cooling the gas may optionally be added. The gas may be injected at a temperature comprised between 5° C. and 25° C.

The first control means and the second control means may be integrated into the electrical control and supply assembly 41.

The injecting means may comprise a gas reserve 60, the gas for example being air (for example in compressed form), dinitrogen or helium. The gas reserve is connected to a main inlet produced in the enclosure 3, said main inlet for example being arranged in the upper wall 30 of the enclosure. The injecting means advantageously comprise at least one valve 61 that is controllable to adjust the gas flow rate injected into the enclosure 3 via said main inlet. The principle of control of the valve 61 is explained below. By way of example, the gas may be injected with a flow rate comprised between 0.5 L and 10 L per second.

The injecting means may comprise a plurality of apertures 62 produced through the first panel 300 of the upper wall of the enclosure, each aperture opening into the inside of the enclosure. These apertures may take the form of a plurality of rows. Each row of apertures 62 may be inserted between two rows of light-emitting diodes 40 (FIG. 4). Each aperture 62 comprises an inlet connected to the main gas inlet and an outlet opening into the inside of the enclosure 3.

Advantageously, the enclosure 3 may comprise a second panel 301 fastened to the first panel 300, above the first panel, forming with said first panel the upper wall 30 of the enclosure 3. The function of this second panel 301 is to distribute the gas between the various apertures. The second panel may thus incorporate a planar spiral channel 302. The channel 302 is added downstream of the main gas inlet. When the gas flow F is injected, it follows the spiral shape of the channel 302. The first panel 300 is fastened under the second panel 301 such that the inlet of each aperture 62 produced through the first panel 300 communicates with the channel. By flowing through the channel 302, the gas is thus uniformly distributed through the apertures 62 and diffuses into the enclosure 3.

Advantageously, the system may comprise cooling means, arranged and configured to cool the radiation source and/or the injected gas. These cooling means may comprise a serpentine 50 through which a heat-transfer fluid flows and an external pumping system 51 that is intended to make the heat-transfer fluid flow through the serpentine 50. This serpentine 50 may be integrated into the first panel 300 of the upper wall 30 of the enclosure and may be arranged above the set of LEDs 40 so as to dissipate heat from the radiation source. The cooling means may also be employed to cool the gas injected into the enclosure 3. The apertures 62 may thus be arranged to pass through the serpentine 50, thus allowing the gas to be cooled in contact with the serpentine.

The first control means for controlling the injecting means are configured to manage the gas flow rate injected into the enclosure 3, taking into account the measured temperature of the stack 10.

The system thus comprises means for measuring the temperature of the stack 10 to be irradiated. These measuring means may comprise a sensor 70 of pyrometer type arranged under the stack 10 and for example fastened to the upper side of the lower wall 31 of the enclosure 3. This sensor 70 is intended to sense the temperature of the stack 10 and not the ambient temperature present inside the enclosure 3.

Figure 7:
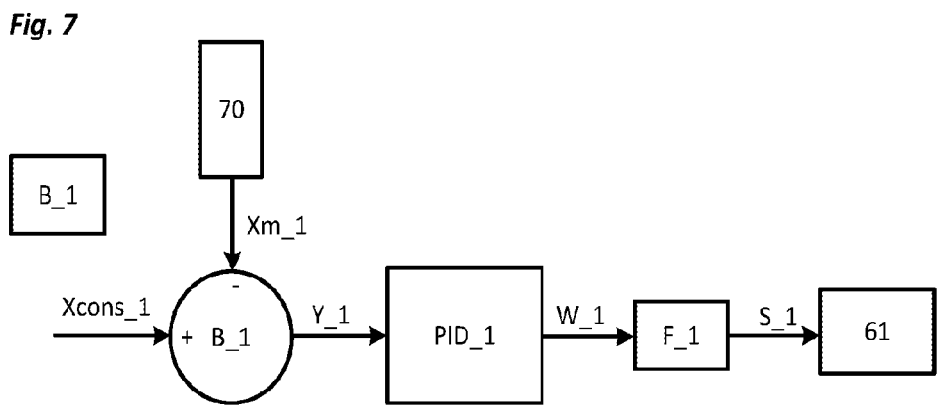
FIG. 7 shows a diagram showing an example of a temperature-regulating loop executed to control the gas-injecting means.

With reference to FIG. 7, the first control means are configured to execute a first temperature-regulating loop with a view to suitably controlling the valve and to adjusting the injected gas flow rate to the temperature of the stack 10.

By way of example, this first regulating loop B_1 may have the following structure:
a comparing unit C_1 receives as input a temperature setpoint value Xcons_1 and a measured temperature value Xm_1 of the stack 10 (as measured by the pyrometer); the setpoint value Xcons_1 corresponds to the temperature that it is desired to obtain. It may be about 200° C., and for example comprised between 180° C. and 250° C.
the first comparing unit B_1 is configured to determine the difference Y_1 between the two temperature values received as input;

the difference Y_1 between the two temperature values is injected into a corrector PID_1 (PID standing for Proportional—Integral— Derivative), this corrector being intended to determine, as output, a command W_1 representative of the temperature difference received as input;

the transfer function F_1 of the process determines the control signal S_1 to be applied to the controllable valve 61 to regulate the measured temperature to the setpoint value.

Depending on the measured temperature of the stack 10 and on its variation with respect to the setpoint value, the gas flow rate injected into the enclosure 3 will thus be increased, kept constant or decreased.

The cooling unit also comprises means for evacuating the gas flow F injected into the enclosure 3, in order to extract the heat transferred during cooling. These evacuating means may comprise one or more fans 80, 81.

Figure 5:
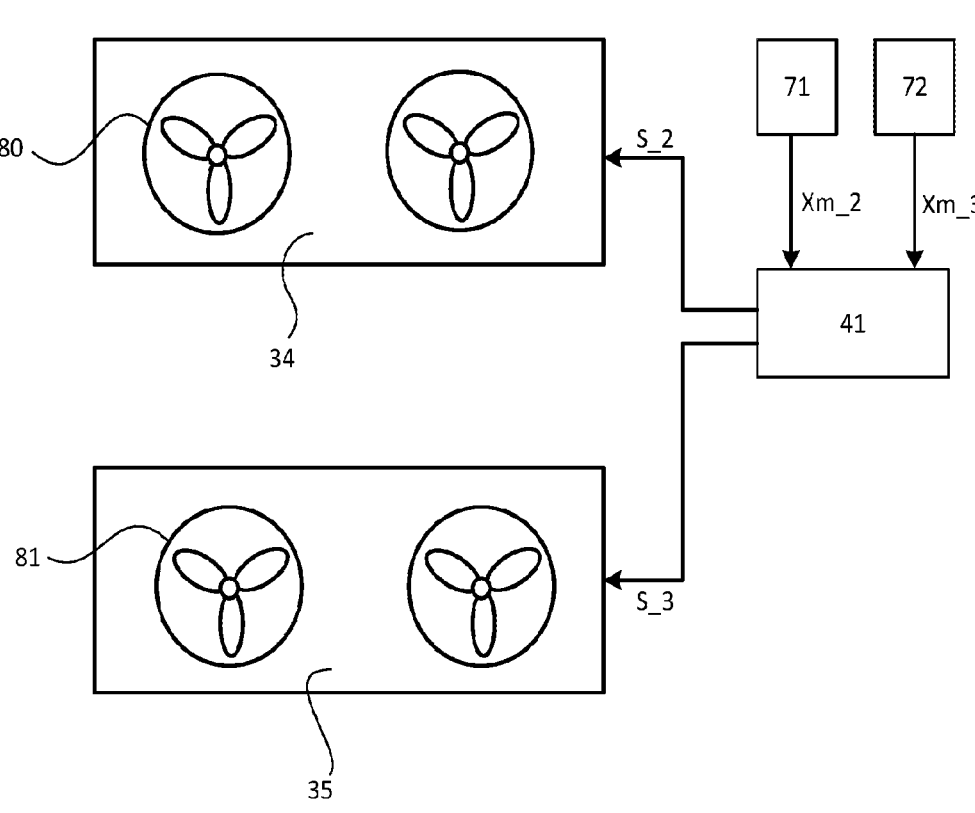
FIG. 5 illustrates the operating principle of the means for evacuating the gas flow.

Non-limitingly, as shown in FIG. 5, the evacuating means take the form of a plurality of fans. The fans are for example integrated into the two second sidewalls 34, of the enclosure 3.

The fans 80, 81 are advantageously all identical. Non-limitingly, they may be controlled separately, in groups. A first group comprising one or more fans 80 integrated into a first sidewall 34 of the second sidewalls and a second group comprising one or more fans 81 integrated into the opposite sidewall 35 may thus be defined.

By way of example, the evacuating means may comprise a total of four fans, two fans per group.

In each group of a plurality of fans, the fans 80, 81 are controlled identically to rotate at the same speed.

The second control means are configured to execute, for each group of fans, a temperature-regulating loop, taking into account the ambient temperature measured inside the enclosure 3.

The system thus comprises means for measuring the temperature inside the enclosure 3. They may comprise one or more temperature probes 71, 72. Advantageously, the system may comprise a first probe 71 dedicated to regulation of the first group of fans 80 and a second probe 72 dedicated to regulation of the second group of fans 81.

Figure 8:
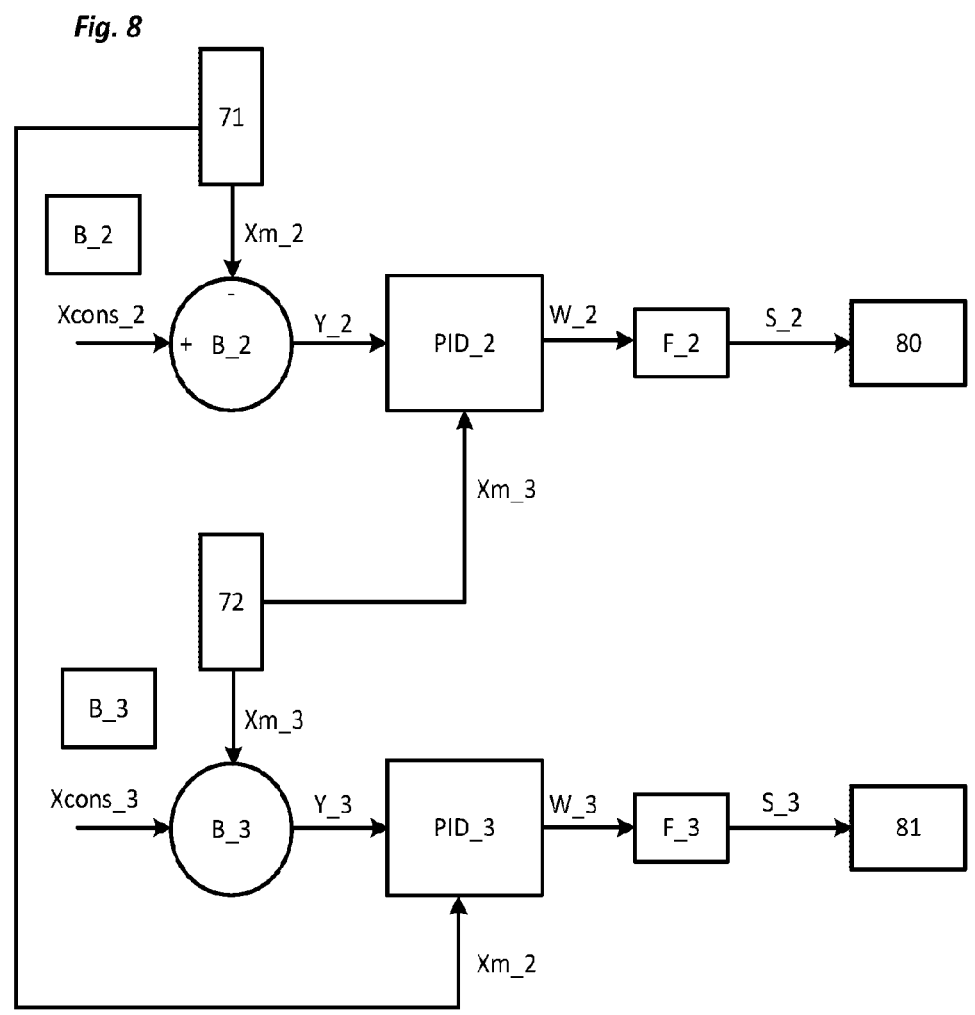
FIG. 8 shows a diagram showing an example of a temperature-regulating loop executed to control the means for evacuating the gas flow.

With reference to FIG. 5 and FIG. 8, for the first group of fans 80, the regulating loop B_2 may have the following structure:

a comparing unit C_2 receives as input a temperature setpoint value Xcons_2 and a value Xm_2 of the temperature measured inside the enclosure 3 by a temperature probe 71; the setpoint value Xcons_2 corresponds to the temperature that it is desired to obtain. It may be about 200° C., and for example comprised between 180° C. and 250° C.

the difference Y_2 between the two temperature values is injected into a corrector PID_2 (PID standing for Proportional—Integral— Derivative), this corrector being intended to determine, as output, a command W_2 representative of the temperature difference received as input;

the transfer function F_2 of the process determines the control signal S_2 to be applied to the evacuating means, i.e. to the fans.

The same regulating loop may be executed for the second group of fans 81. In FIG. and FIG. 8, the index_3 has been used to reference this loop B_3.

Depending on the temperature measured inside the enclosure 3 and on its variation with respect to the setpoint value Xcons_2, Xcons_3, the speed of rotation of the fans 80, 81 of the group will be increased, kept constant or decreased.

According to one particularity, as illustrated in FIG. 8, the temperature measured by each temperature probe 71, 72 dedicated to one group of fans may be injected into the regulating loop intended to regulate the other group of fans. Each corrector PID_2, PID_3 of a regulating loop receives the measured temperature of the other regulating loop. The two regulating loops are thus interlaced. In other words, the second control means may be configured to act on each corrector PID_2, PID_3 with a view to adjusting the correction to be made. It may notably be a question of making a larger correction with one group than with the other, depending on the obtained temperature measurements, for example in order to achieve a uniform temperature inside the enclosure.

Figure 6:
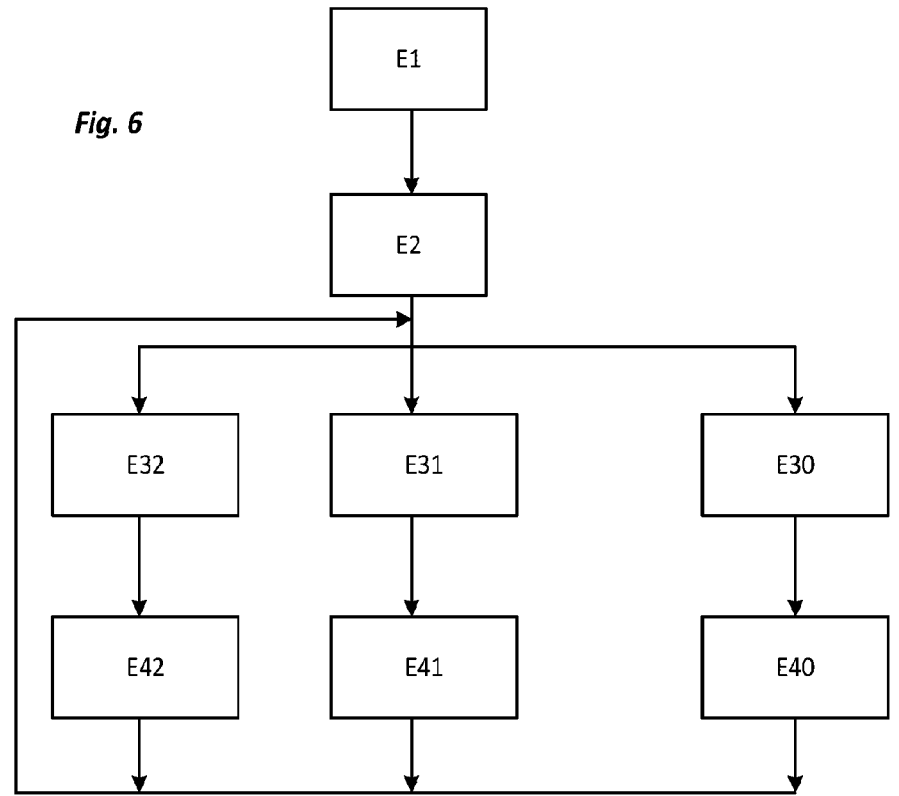
FIG. 6 shows a diagram illustrating the cooling principle employed in the system of the invention.

Using the architecture described above, with reference to FIG. 6, the treatment process effects the following steps:

E1: The stack 10 is in position inside the enclosure 3, ready to receive the radiation R;

E2: The radiation source formed from the light-emitting diodes 40 is activated by the electrical control and supply assembly 41;

E30, E31, E32: After activation of the radiation R, the temperature is measured respectively:

by the temperature sensor 70, to measure the temperature of the stack 10 (step E30);

by the first temperature probe 71, to measure the temperature in the enclosure 3 with a view to controlling the first group of fans 80 (step E31); and by the second temperature probe 72, to measure the temperature in the enclosure with a view to controlling the second group of fans 81 (step E32); E40, E41, E42: Depending on the temperatures measured, the various regulating actions are implemented by:

controlling the valve 61 to adjust the gas flow F injected into the enclosure 3 through execution of the first regulating loop B_1 (step E40);

controlling the first group of fans 80 to evacuate heat through application of the second regulating loop B_2 (step E41);

controlling the second group of fans 81 to evacuate heat through execution of the third regulating loop B_3 (step E42).

This procedure is applied for a determined time, as long as the radiation R is being emitted, and optionally after emission has stopped to ensure a sufficient decrease in the temperatures in the enclosure 3.

Some variant embodiments may be envisaged:

it is possible to make provision for a shape other than the spiral shape of the planar channel 302; the principle is to preserve a uniform distribution of the gas inside the enclosure 3;

the means for evacuating the gas flow may comprise a fan integrated into the lower wall 31 of the enclosure 3, adding to or replacing the fans already present;

the system may comprise a device for measuring the current flowing through each strip of light-emitting diodes 40; depending on the measured current, the electrical control and supply assembly 41 may adjust the settings of each strip of light-emitting diodes; it is also possible to detect a malfunction in a strip of light-emitting diodes, the system may incorporate a plurality of gas inlets opening into the inside of the enclosure 3, a separate controllable valve allowing the gas flow rate injected via each of these inlets to be adjusted;

the electrical control and supply assembly 41 of the light-emitting diodes, the first control means and the second control means may be combined into a single control unit, which is fastened to the enclosure 3, for example to its upper wall 30;

the regulating loops may be realized according to other variants.

The invention has many advantages, among which:

it offers a concrete solution to cooling during radiation treatment of a stack;

it has a simple architecture, which is easily integrable into a photovoltaic-cell production line.

The invention claimed is:

1. A method for treating a stack for manufacturing a photovoltaic cell, said stack comprising at least:

a crystalline silicon substrate, a first passivation layer made of hydrogenated amorphous silicon, placed on a first side of the substrate, and a first layer made of amorphous silicon doped a first conductivity type, placed on the first passivation layer, said process comprising:

placing said stack in an enclosure, exposing said stack to electromagnetic radiation, measuring the temperature of the stack, measuring the ambient temperature present in said enclosure, and cooling said stack during exposure, wherein said cooling said stack comprises:

injecting a gas flow into said enclosure, regulating the injected gas flow taking into account the measured temperature of the stack, and evacuating the gas flow from the enclosure taking into account the ambient temperature measured in said enclosure.

2. The method according to claim 1, wherein the regulating comprises:

measuring the temperature of the stack, comparing the measured temperature with a first setpoint value, and controlling an injection valve controlling injection of the gas flow into the enclosure depending on the difference between the measured temperature and said setpoint value.

3. The method according to claim 1, wherein the evacuating the gas flow comprises:

measuring the ambient temperature present in said enclosure, comparing the measured ambient temperature with a second setpoint value, and controlling means for evacuating the gas flow from the enclosure depending on the difference between the measured ambient temperature and said second setpoint value.

4. A system for treating a stack for manufacturing a photovoltaic cell, said stack comprising:

a crystalline silicon substrate, a first passivation layer made of hydrogenated amorphous silicon, placed on a first side of the substrate, a first layer made of amorphous silicon doped a first conductivity type, placed on the first passivation layer, said system comprising:

an enclosure configured to receive said stack, a source configured to emit electromagnetic radiation towards said stack, first means for measuring the temperature of the stack, second means for measuring the ambient temperature inside the enclosure, means for injecting a gas flow into the enclosure via a main inlet, first control means for controlling said means for injecting the gas flow, taking into account the measured temperature of the stack, means for evacuating the gas flow from the enclosure, and second control means for controlling the evacuating means, taking into account the ambient temperature measured inside the enclosure.

5. The system according to claim 4, wherein the means for emitting electromagnetic radiation comprise light-emitting diodes.

6. The system according to claim 4, wherein the means for injecting the gas flow comprise at least one valve that is controllable by said first control means, said valve being arranged on said main gas inlet.

7. The system according to claim 6, wherein the injecting means comprise a plurality of apertures that are produced through a wall of said enclosure and that are connected to said main gas inlet.

8. The system according to claim 7, wherein the injecting means comprise a channel for distributing the gas, arranged between said main inlet and said apertures.

9. The system according to claim 8, wherein said distributing channel is of the planar spiral type.

10. The system according to claim 4, further comprising means for cooling said source of electromagnetic radiation and/or the gas flow injected into said enclosure.

11. The system according to claim 4, wherein the means for evacuating the gas flow comprise one or more fans arranged in a wall of the enclosure.

12. The system according to claim 4, wherein the first control means are configured to execute a first temperature-regulating loop, based on the temperature measured by the first measuring means and on a first setpoint value.

13. The system according to claim 4, wherein the second control means are configured to execute a second temperature-regulating loop based on the temperature measured by the second measuring means and on a second setpoint value.

* * * * *